(12) United States Patent
Potkonjak

(10) Patent No.: US 10,095,658 B2
(45) Date of Patent: Oct. 9, 2018

(54) HETEROGENEOUS MULTICORE PROCESSOR WITH GRAPHENE-BASED TRANSISTORS

(71) Applicant: EMPIRE TECHNOLOGY DEVELOPMENT LLC, Wilmington, DE (US)

(72) Inventor: Miodrag Potkonjak, Los Angeles, CA (US)

( * ) Notice: Subject to any disclaimer, the term of this patent is extended or adjusted under 35 U.S.C. 154(b) by 393 days.

(21) Appl. No.: 14/411,917

(22) PCT Filed: Aug. 15, 2013

(86) PCT No.: PCT/US2013/055025
§ 371 (c)(1),
(2) Date: Dec. 30, 2014

(87) PCT Pub. No.: WO2015/023277
PCT Pub. Date: Feb. 19, 2015

(65) Prior Publication Data
US 2016/0232127 A1 Aug. 11, 2016

(51) Int. Cl.
*G06F 15/80* (2006.01)
*G06F 9/50* (2006.01)
(Continued)

(52) U.S. Cl.
CPC .............. *G06F 15/80* (2013.01); *G06F 1/329* (2013.01); *G06F 1/3296* (2013.01);
(Continued)

(58) Field of Classification Search
CPC .......... G06F 15/80; G06F 9/52; G06F 9/5094; G06F 1/329; G06F 1/3296; H01L 29/165;
(Continued)

(56) References Cited

U.S. PATENT DOCUMENTS

| 8,409,957 | B2 | 4/2013 | Chang et al. |
| 8,450,779 | B2 | 5/2013 | Guo et al. |

(Continued)

FOREIGN PATENT DOCUMENTS

| CN | 102782856 A | 11/2012 |
| CN | 102799418 A | 11/2012 |

(Continued)

OTHER PUBLICATIONS

Miguel R. Corazao et al., "Performance Optimization Using Template Mapping for Datapath-Intensive High-Level Synthesis", IEEE Transactions on Computer-aided Design of Integrated Circuits and Systems, Aug. 1996, pp. 877-888, vol. 15, No. 8.
(Continued)

*Primary Examiner* — Benjamin P Geib
*Assistant Examiner* — Shawn Doman
(74) *Attorney, Agent, or Firm* — IP Spring

(57) ABSTRACT

Techniques described herein generally include methods and systems related to the use of processors that include graphene-containing computing elements while minimizing or otherwise reducing the effects of high leakage energy associated with graphene computing elements. Furthermore, embodiments of the present disclosure provide systems and methods for scheduling instructions for processing by a chip multiprocessor that includes graphene-containing computing elements arranged in multiple processor groups.

13 Claims, 8 Drawing Sheets

(51) Int. Cl.
  *G06F 1/32*     (2006.01)
  *H01L 29/16*    (2006.01)
  *G06F 9/52*     (2006.01)
  *H01L 29/165*    (2006.01)
(52) U.S. Cl.
  CPC .............. *G06F 9/5094* (2013.01); *G06F 9/52* (2013.01); *H01L 29/165* (2013.01); *H01L 29/1606* (2013.01); *Y02D 10/172* (2018.01); *Y02D 10/22* (2018.01); *Y02D 10/24* (2018.01)
(58) Field of Classification Search
  CPC . H01L 29/1606; Y02B 60/144; Y02B 60/142; Y02B 60/1285
  USPC .......................................................... 712/16
  See application file for complete search history.

(56) References Cited

U.S. PATENT DOCUMENTS

| | | |
|---|---|---|
| 2004/0172603 A1 | 9/2004 | Collmeyer et al. |
| 2005/0204316 A1 | 9/2005 | Nebel et al. |
| 2005/0235232 A1 | 10/2005 | Papanikolaou et al. |
| 2006/0171244 A1* | 8/2006 | Ando ................. G06F 12/0897 365/52 |
| 2011/0067029 A1 | 3/2011 | Wolfe et al. |
| 2011/0114919 A1 | 5/2011 | Jenkins et al. |
| 2011/0191776 A1 | 8/2011 | Bose et al. |
| 2011/0296368 A1 | 12/2011 | Reis et al. |
| 2012/0074387 A1 | 3/2012 | King |
| 2012/0181508 A1 | 7/2012 | Chang et al. |
| 2012/0181510 A1 | 7/2012 | Avouris et al. |
| 2013/0013911 A1* | 1/2013 | Gustafsson ............ G06F 1/3203 713/100 |
| 2013/0297919 A1* | 11/2013 | Kang ........................ G06F 9/30 712/241 |

FOREIGN PATENT DOCUMENTS

| | | |
|---|---|---|
| TW | 201201340 A | 1/2012 |
| WO | 2012010934 A1 | 1/2012 |

OTHER PUBLICATIONS

Inki Hong et al., "On-Line Scheduling of Hard Real-Time Tasks on Variable Voltage Processor", 1998 IEEE/ACM international conference on Computer-aided design, Nov. 1, 1998, pp. 653-656.
Inki Hong et al., "Synthesis Techniques for Low-Power Hard Real-Time Systems on Variable Voltage Processors", Proceedings of 19th IEEE Real-Time System Symposium, Dec. 2-4, 1998, pp. 178-187.
Miodrag Potkonjak et al., "Behavioral Optimization Using the Manipulation of Timing Constraints", IEEE Transactions on Computer-Aided Design of Integrated Circuits and Systems, Oct. 1998, pp. 936-947, vol. 17, No. 10.
James W. Tschanz et al., "Adaptive Body Bias for Reducing Impacts of Die-to-Die and Within-Die Parameter Variations on Microprocessor Frequency and Leakage", IEEE Journal of Solid-State Circuits, Nov. 2002, pp. 1396-1402, vol. 37, No. 11.
Kimiyoshi Usami et al., "Automated Low-Power Technique Exploiting Multiple Supply Voltages Applied to a Media Processor", IEEE Journal of Solid-State Circuits, Mar. 1998, pp. 463-472, vol. 33, No. 3.
Qing Wu et al., "Clock-Gating and Its Application to Low Power Design of Sequential Circuits", IEEE Transactions on Circuits and Systems I: Fundamental Theory and Applications, Mar. 2000, pp. 415-420, vol. 47, No. 103.
Sergi Abadal et al., "Graphene-Enabled Hybrid Architectures for Multiprocessors: Bridging Nanophotonics and Nanoscale Wireless Communication", 14th International Conference on Transparent Optical Networks (ICTON), Jul. 2-5, 2012, pp. 4.
Asenasenov, "Random Dopant Induced Threshold Voltage Lowering and Fluctuations in Sub-0.1 μm MOSFET's: A 3-D "Atomistic" Simulation Study", IEEE Transactions on Electron Devices, Dec. 1998, pp. 2505-2513, vol. 45, No. 12.
Phaedon Avouris, "Graphene: Electronic and Photonic Properties and Devices", Nano Letters, 2010, pp. 4285-4294, vol. 10, Issue 11.
Giuseppe C. Calafiore et al., "The Scenario Approach to Robust Control Design", IEEE Transactions on Automatic Control, May 2006, pp. 742-753, vol. 51, No. 5.
B. Cheng et al., "Evaluation of Statistical Variability in 32 and 22 nm Technology Generation LSTP MOSFETs", Solid-State Electronics, 2009, pp. 767-772 , vol. 53.
Brian Cline et al., "Analysis and Modeling of CD Variation for Statistical Static Timing", IEEE/ACM International Conference on Computer-Aided Design, ICCAD '06, Nov. 5-9, 2006, pp. 60-66.
Andre Dehon et al., "Nanowire-Based Sublithographic Programmable Logic Arrays", In Proceedings of the 2004 ACM/SIGDA 12th international symposium on Field programmable gate arrays (FPGA '04), Feb. 22, 2004, pp. 123-132.
Steven G. Duvall, "Statistical Circuit Modeling and Optimization", 2000 5th International Workshop, 2000, pp. 56-63.
Gianluca Fiori et al., "Multiscale Modeling for Graphene-Based Nanoscale Transistors", Proceedings of the IEEE, Jul. 2013, pp. 1653-1669, vol. 101, No. 7.
Stephen Friedman et al., "SPR: An Architecture-Adaptive CGRA Mapping Tool", In Proceedings of FPGA, Feb. 22-24, 2009, pp. 191-200.
A. K. Geim, "Graphene: Status and Prospects", Science, Jun. 19, 2009, pp. 1530-1534, vol. 324.
A. K. Geim et al., "The Rise of Graphene", Nature Materials, Mar. 2007, pp. 183-191, vol. 6.
Benjamin Gojman et al., "3D Nanowire-Based Programmable Logic", Appearing in International Conference on Nano-Networks, Sep. 14-16, 2006, pp. 5.
Seth Copen Goldstein et al., "NanoFabrics: Spatial Computing Using Molecular Electronics", in Proceedings of the 28th Annual International Symposium on Computer Architecture, Jun. 2001, pp. 178-189.
Tom R. Halfhill, "Tabula's Time Machine", Microprocessor Report, 29 March 2010-01, pp. 14.
Pat Hanrahan, "Domain-Specific Languages for Heterogeneous Computing Platforms", Parallel @ Illinois DLS, Apr. 15, 2010, pp. 30.
Inki Hong et al., "Power Optimization of Variable-Voltage Core-Based Systems", IEEE Transactions on Computer-Aided Design of Integrated Circuits and Systems, Dec. 1999, pp. 1702-1714, vol. 18, No. 12.
International Search Report and Written Opinion of the International Searching Authority, International application No. PCT/US2013/055025, dated Oct. 8, 2013.
International Search Report and Written Opinion of the International Searching Authority, International application No. PCT/US2013/055024, dated Oct. 30, 2013.
D. Jones et al., "A Time-Multiplexed FPGA Architecture for Logic Emulation", Proceedings of the IEEE on Custom Integrated Circuits Conference, May 1-4, 1995, pp. 495-498.
Santosh Khasanvis et al., "Hybrid Graphene Nanoribbon-CMOS Tunneling Volatile Memory Fabric", IEEE/ACM International Symposium on Nanoscale Architectures (NANOARCH), Jun. 8-9, 2011, pp. 189-195.
Darko Kirovski et al., "System-Level Synthesis of Low-Power Hard Real-Time Systems", in Proceedings of the 34th Design Automation Conference, Jul. 9-13, 1997, pp. 697-702.
Darko Virovski et al., "Synthesis of Power Efficient Systems-on-Silicon", Design Automation Conference 1998. Proceedings of the ASP-DAC '98. Asia and South Pacific, Feb. 10-13, 1998, pp. 557-562.
Dejan Markovic et al., "Ultralow-Power Design in Near-Threshold Region", Proceedings of the IEEE, Feb. 2010, pp. 237-252, vol. 98, No. 2.
Arkadi Memirovski et al., "Convex Approximations of Change Constrained Programs", SIAM J. Optim., 2006, pp. 969-996, vol. 17, No. 4, Society for Industrial and Applied Mathematics.

(56) References Cited

OTHER PUBLICATIONS

Miodrag Potkonjak et al., "Algorithm Selection: A Quantitative Optimization-Intensive Approach," IEEE Transactions on Computer-Aided Design of Integrated Circuits and Systems, May 1999, pp. 524-532, vol. 18, No. 5.

Miodrag Potkonjak et al., "Power Minimization in DSP Application Specific Systems Using Algorithm Selection", International Conference on Acoustics, Speech, and Signal Processing (ICASSP-95), May 9-12, 1995, pp. 2639-2642, vol. 4.

Smruti R. Sarangi et al., "VARIUS: A Model of Process Variation and Resulting Timing Errors for Microarchitects", IEEE Transactions on Semiconductor Manufacturing, Feb. 2008, pp. 3-13, vol. 21, No. 1.

Stephen M. Scalera, "The Design and Implementation of a Context Switching FPGA", in Proceedings of IEEE Symposium on Field-Programmable Custom Computing Machines, Apr. 15-17, 1998, pp. 78-85.

Frank Schwierz, "Industry-Compatible Graphene Transistors", Nature, Apr. 7, 2011, pp. 41-42, vol. 472.

Dmitri B Struckov et al., "CMOL FPGA: A Reconfigurable Architecture for Hybrid Digital Circuits with Two-Terminal Nanodevices", Nanotechnology, Apr. 19, 2005, pp. 888-900, vol. 16, Institute of Physics Publishing.

Sansiri Tanachutiwat et al., "Reconfigurable Multi-Function Logic Based on Graphene P—N Junctions", DAC'10, Jun. 13-18, 2010, pp. 883-888.

Steve Trimberger et al., "A Time-Multiplexed FPGA", Field-Programmable Custom Computing Machines, in Proceedings of the 5th Annual IEEE Symposium, Apr. 16-18, 1997, pp. 22-28.

D. Tu et al., "Three-Dimensional CMOL: Three-Dimensional Integration of CMOS/Nanomaterial Hybrid Digital Circuits", Micro & Nano Letters, Jun. 2007, pp. 40-45, vol. 2, Issue 2.

Alireza Vahdatpour et al., "Leakage Minimization Using Self Sensing and Thermal Management", ACM/IEEE International Symposium on Low-Power Electronics and Design (ISLPED), Aug. 18-20, 2010, pp. 265-270.

Rafael Vargas-Bernal et al., "Carbon Nanotube- and Graphene Based Devices, Circuits and Sensors for VLSI Design", In VLSI Design Chapter 3, Jan. 2012, pp. 41-66.

Andy Ye et al., "Using Bus-Based Connections to Improve Field-Programmable Gate-Array Density for Implementing Datapath Circuits", IEEE Transactions on Very Large Scale Integration (VLSI) Systems, May 2006, pp. 462-473, vol. 14, No. 5.

Wei Zhang et al., "Low-Power 3D Nano/CMOS Hybrid Dynamically Reconfigurable Architecture", ACM Journal on Emerging Technologies in Computing Systems, Aug. 2010, pp. 32, vol. 6, No. 3, Article 10.

Wei Zhang et al., "NATURE: A Hybrid Nanotube/CMOS Dynamically Reconfigurable Architecture", In Proceedings of the 43rd annual Design Automation Conference (DAC '06), Jul. 24-28, 2006, pp. 711-716.

"Monolithically-integrated graphene structures as sensors," Harvard University Office of Technology Development, accessed at https://web.archive.org/web/20120417140700/http://www.techtransfer.harvard.edu/technologies/tech.php?case=3844, archived on Apr. 17, 2012, accessed on Aug. 9, 2017, 2 Pages.

Caspi, E., et al., "Stream Computations Organized for Reconfigurable Execution (SCORE) : Introduction and Tutorial," International Workshop on Field Programmable Logic and Applications, Aug. 25, 2000, pp. 1-31.

Coudert, O., "Gate Sizing for Constrained Delay/Power/Area Optimization," IEEE Transactions on Very Large Scale Integration (VLSI) Systems, vol. 5, Issue 4, Dec. 1997, pp. 465-472.

Lu, F-S., et. al., "Survey of CPU/GPU Synergetic Parallel Computing," Computer Science, vol. 38, No. 03, pp. 06 (Mar. 2011) (See English Abstract).

\* cited by examiner

HETEROGENEOUS MULTICORE PROCESSOR WITH GRAPHENE-BASED TRANSISTORS

CROSS REFERENCE TO RELATED APPLICATIONS

The present application is a U.S. National Stage filing under 35 U.S.C. § 371 of International Application No. PCT/US2013/055025, filed Aug. 15, 2013 and entitled "HETEROGENEOUS MULTICORE PROCESSOR WITH GRAPHENE-BASED TRANSISTORS." The present application is also related to International Application No. PCT/US2013/055024, filed Aug. 15, 2013 and entitled "YIELD OPTIMIZATION OF PROCESSOR WITH GRAPHENE-BASED TRANSISTORS." International Application No. PCT/US2013/055025 and International Application No. PCT/US2013/055024, including any appendices or attachments thereof, are hereby incorporated by reference in their entirety.

BACKGROUND

Unless otherwise indicated herein, the approaches described in this section are not prior art to the claims in this application and are not admitted to be prior art by inclusion in this section.

In keeping with Moore's Law, the number of transistors that can be practicably incorporated into an integrated circuit has doubled approximately every two years. This trend has continued for more than half a century and may be expected to continue until at least 2015 or 2020. However, simply adding more transistors to a single-threaded processor no longer produces a significantly faster processor. Instead, increased system performance has been attained by integrating multiple processor cores on a single chip to create a chip multiprocessor, and by sharing processes between the multiple processor cores of the chip multiprocessor. System performance and power usage can be further enhanced with chip multiprocessors that have core elements configured for multiple instruction sets or for handling different subsets of instruction sets.

SUMMARY

In accordance with at least some embodiments of the present disclosure, a chip multiprocessor comprises one or more high-speed processor cores disposed on a die and including graphene-containing computing elements. The high-speed processor cores are configured to operate when all other processor cores on the die that include a lower percentage of graphene-containing computing elements than the one or more high-speed processor cores are configured to be gated. The chip multiprocessor further comprises one or more additional processor cores disposed on the die and including a lower percentage of graphene-containing computing elements than the one or more high-speed processor cores.

In accordance with at least some embodiments of the present disclosure, a method to schedule instructions to be processed by a chip multiprocessor that includes graphene-containing computing elements arranged in multiple processor groups comprises determining at least one of a time cost, an energy cost, and a thermal cost for one or more of the multiple processor groups to execute a first block of instructions from an application and determining at least one of a time cost, an energy cost, and a thermal cost for one or more of the multiple processor groups to execute a second block of instructions from the application. The method may further comprise determining context switching costs associated with switching execution of the application from any one of the multiple processor groups to any other of the multiple processor groups, the context switching taking place after the first block of instructions is executed by a first of the multiple processor groups and before the second block of instructions is executed by a second of the multiple processor groups, and, based on at least one of the determined time cost, energy cost, and thermal cost and on the determined context switching costs, selecting one of the multiple processor groups to execute the first block of instructions and selecting one of the multiple processor groups to execute the second block of instructions.

In accordance with at least some embodiments of the present disclosure, a method to schedule instructions to be processed by a chip multiprocessor that includes graphene-containing computing elements arranged in multiple processor groups comprises determining at least one of a time cost, an energy cost, and a thermal cost for each of the multiple processor groups to execute a first block of instructions from an application and, based on at least one of the determined time, energy cost, and thermal cost, selecting a first of the multiple processor groups to execute the first instruction set. The method may further comprise determining at least one of a time cost, an energy cost, and a thermal cost for each of the multiple processor groups to execute a second block of instructions from the application, and, based on at least one of the determined time cost, energy cost, and thermal cost, selecting a second of the multiple processor groups to execute the second instruction set, the selecting of the second of the multiple processor groups being performed after the first of the multiple processor groups has begun execution of the first block of instructions.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. The disclosure will be described with additional specificity and detail through use of the accompanying drawings.

DETAILED DESCRIPTION

Figure 1:
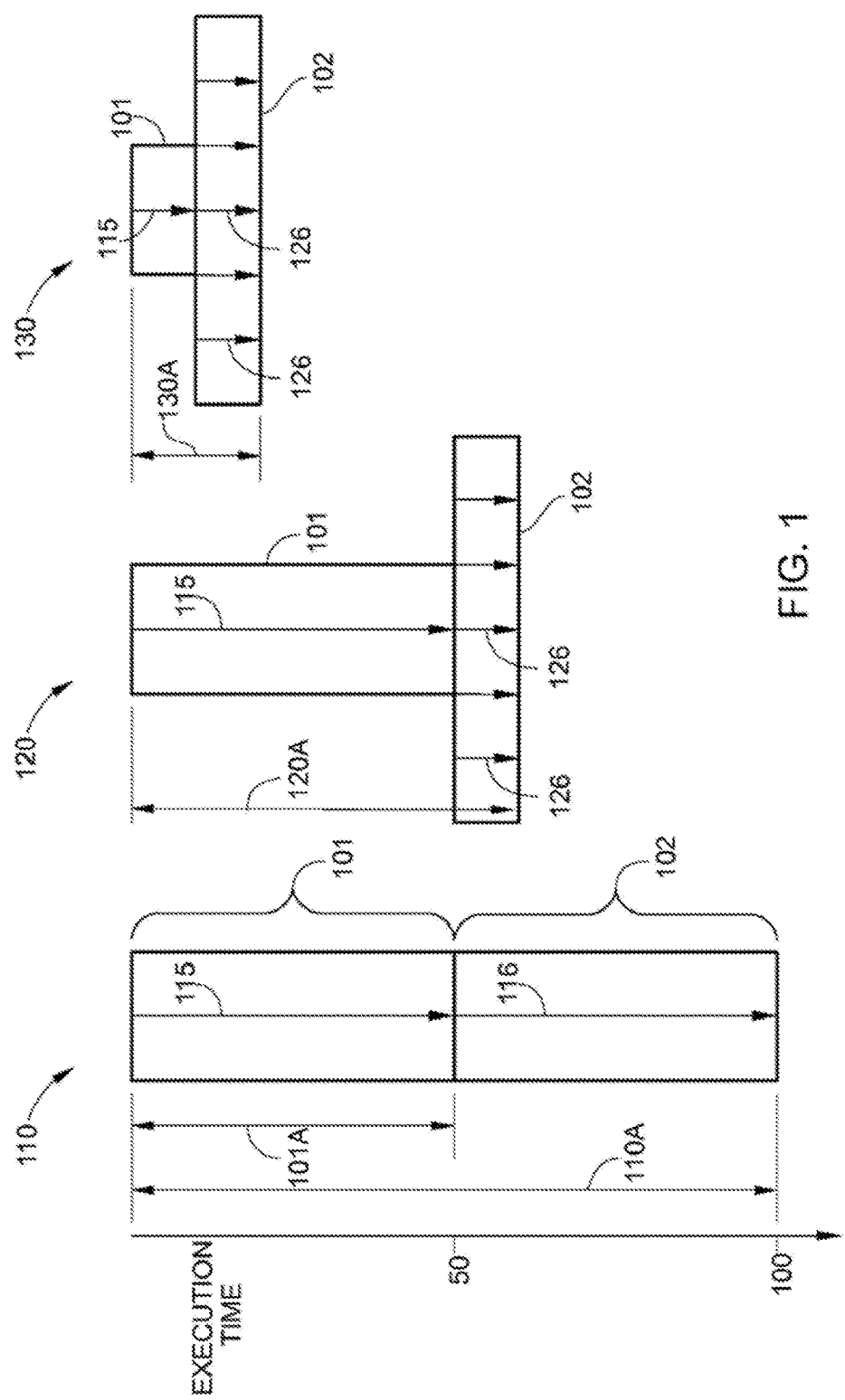
FIG. 1 is a diagram representing example relative execution times of a particular computer program when performed by three different configurations of a chip multiprocessor: a processor unoptimized for parallel processing, a chip multiprocessor optimized for parallel processing, and a graphene-containing chip multiprocessor.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. The aspects of the disclosure, as generally described herein, and illustrated in the Figures, can be arranged, substituted, combined, and designed in a wide variety of different configurations, all of which are explicitly contemplated and made part of this disclosure.

This disclosure is generally drawn, inter alia, to methods, apparatus, systems, devices, and/or computer program products related to chip multiprocessors.

Briefly stated, techniques described herein generally include methods and systems related to the use of processors that include graphene-containing computing elements while minimizing or otherwise reducing the effects of high leakage energy associated with graphene computing elements. Furthermore, embodiments of the present disclosure provide systems and methods for scheduling instructions for processing by a chip multiprocessor that includes graphene-containing computing elements arranged in multiple processor groups.

There is a trend toward large-scale chip multiprocessors that include a relatively large number of processor cores, with core counts as high as hundreds or thousands envisioned in the near future. Such processors can greatly reduce processing time for applications that have high levels of concurrency, e.g., applications in which multiple computations can be executed simultaneously or in parallel with each other. However, the majority of applications are generally either "sequential," e.g., unsuitable for parallel processing, or have large portions that are essentially sequential. Limited speed-up is feasible in running such sequential applications by using a chip multiprocessor, regardless of the number of parallel processes that can be supported thereby. For example, if 50% of an application is sequential, even if the execution time of the remaining code is reduced to a single clock cycle, no speed up by a factor higher than 2× may be possible. This effect is illustrated in FIG. 1.

FIG. 1 is a diagram representing example relative execution times of a particular computer program when performed by three different configurations of chip multiprocessor: a processor unoptimized for parallel processing, a chip multiprocessor optimized for parallel processing, and a graphene-containing chip multiprocessor. Execution scheme 110 depicts execution of the computer program with respect to time using the processor unoptimized for parallel processing, execution scheme 120 depicts execution of the computer program with respect to time using the chip multiprocessor optimized for parallel processing, and execution scheme 130 depicts execution of the computer program with respect to time using the graphene-containing chip multiprocessor of one embodiment.

For illustrative purposes, the computer program includes a single sequential processing segment 101 and a single parallel processing segment 102, although typically computer programs can include a plurality of each. Instructions in sequential processing segment 101 can be performed sequentially. For example, sequential processing segment 101 may include a high density of conditionals, thereby rendering parallel processing of the computer program in sequential processing segment 101 inapplicable or impractical. In contrast, instructions in parallel processing segment 102 can be performed in parallel without significant adverse effect on the execution of the computer program and may instead improve the execution of the computer program.

Execution scheme 110 illustrates that when the computer program is executed by the unoptimized processor, a total execution time 110A may be, in this example, 100 sec: time 101A of 50 seconds for executing sequential time segment 101 and 50 seconds for executing parallel processing segment 102. As shown, sequential processing segment 101 may be performed sequentially with a single computing thread 115. Parallel processing segment 102 is also performed sequentially with a single computing thread 116, since the computer program is executed with the processor unoptimized for parallel processing and is unable to perform parallel processing.

Execution scheme 120 illustrates that when the computer program is executed by the chip multiprocessor optimized for parallel processing, execution time 120A is less than total execution time 110A (e.g., 100 seconds) of execution scheme 110, and more than the time 101A (e.g., 50 seconds) for execution of sequential processing segment 101. For example, assuming that the chip multiprocessor optimized for parallel processing includes five cores, each configured to run one of parallel computing threads 126, the execution time for execution scheme 120 is 60 seconds: 50 seconds for executing sequential time segment 101 with computing thread 115 and 10 seconds for executing parallel processing segment 102 with parallel computing threads 126. Clearly, in this particular example, total execution time 120A is not reduced below execution time 101A by using the chip multiprocessor optimized for parallel processing, even if an unlimited number of computing threads 126 can be used.

Execution scheme 130 illustrates that when the computer program is executed by the graphene-containing chip multiprocessor that can be used in one embodiment, execution time 130A can be significantly less than either total execution time 110A of execution scheme 110 or total execution time 120A of execution scheme 120. Furthermore, according to embodiments of the disclosure, execution time 130A can be significantly less than time 101A used for execution of sequential processing segment 101 in execution schemes 110 and 120. This is because a graphene-containing processor core of the multiprocessor may be configured to greatly reduce the time to complete the execution of sequential processing segment 101. In some embodiments of the disclosure, a graphene-containing processor core may be configured to perform sequential processing segment 101 approximately 10 to 100 times faster than a processor core that includes fewer (or no) graphene-containing elements. Various examples of graphene-containing processor cores, configured according to one or more embodiments of the disclosure, are described below. Thus, even when parallel processing segment 102 is executed by the graphene-containing processor core using the same number of parallel computing threads 126 used in execution scheme 120, execution time 130A can be significantly less than total execution time 120A of execution scheme 120. For example, when time 101A for execution of sequential processing segment 101 makes up the majority of total execution time 120A, the duration of execution time 130A may be a small fraction of total execution time 120A, for example 1/10th or less, thereby providing a 10× or greater improvement in performance.

According to embodiments of the present disclosure, a chip multiprocessor includes one or more graphene-containing processor cores that utilize at least some graphene computing elements, such as transistors, in addition to one or more other processor cores that utilize non-graphene silicon transistors and other non-graphene computing elements. A graphene transistor may be a silicon transistor in which the channel of the transistor is formed using graphene. Graphene is an allotrope of carbon whose structure may be a single planar sheet of $sp^2$-bonded carbon atoms that are densely packed in a honeycomb crystal lattice. Generally, all other components can be substantially identical to the components of a complementary metal-oxide semiconductor (CMOS) transistor. Hence, integration of graphene and CMOS transistors in a single processor may be relatively simple and inexpensive. Graphene transistors have numerous desirable properties, including compatibility with silicon transistors, great mobility (at least 10× higher than other transistors), and exceptional feature size scalability. Consequently, graphene transistors can be readily manufactured that operate at much higher speeds than other transistors, e.g., in the terahertz regime. Thus, the use of graphene-containing processors can greatly decrease execution time in highly sequential software applications, such as illustrated in FIG. 1. In addition, graphene transistors may have significantly lower switching energy than silicon transistors, making them well-suited for use in mobile devices or other situations in which energy consumption may be an issue.

However, graphene transistors may have significantly higher leakage than silicon transistors, for example on the order 100,000-5,000,000 times more energy leakage. Furthermore, energy leakage may increase exponentially with temperature in a transistor, and so keeping the operating temperature of graphene transistors low may be useful. According to embodiments of the disclosure, the one or more graphene-containing processor cores that are included in a graphene-containing chip multiprocessor are generally gated or otherwise disabled or placed in a reduced operation mode when an application with a high degree of instruction-level parallelism is being executed, where the degree of instruction-level parallelism of a software application may be generally considered as the number of operations that can be executed in a single clock cycle. The one or more graphene-containing processor cores may be used when execution of the application would benefit from substantially sequential execution. In this way, heating and leakage energy associated with the graphene-containing processor cores may be minimized while operating performance can be greatly increased for sequential execution.

Figure 2:
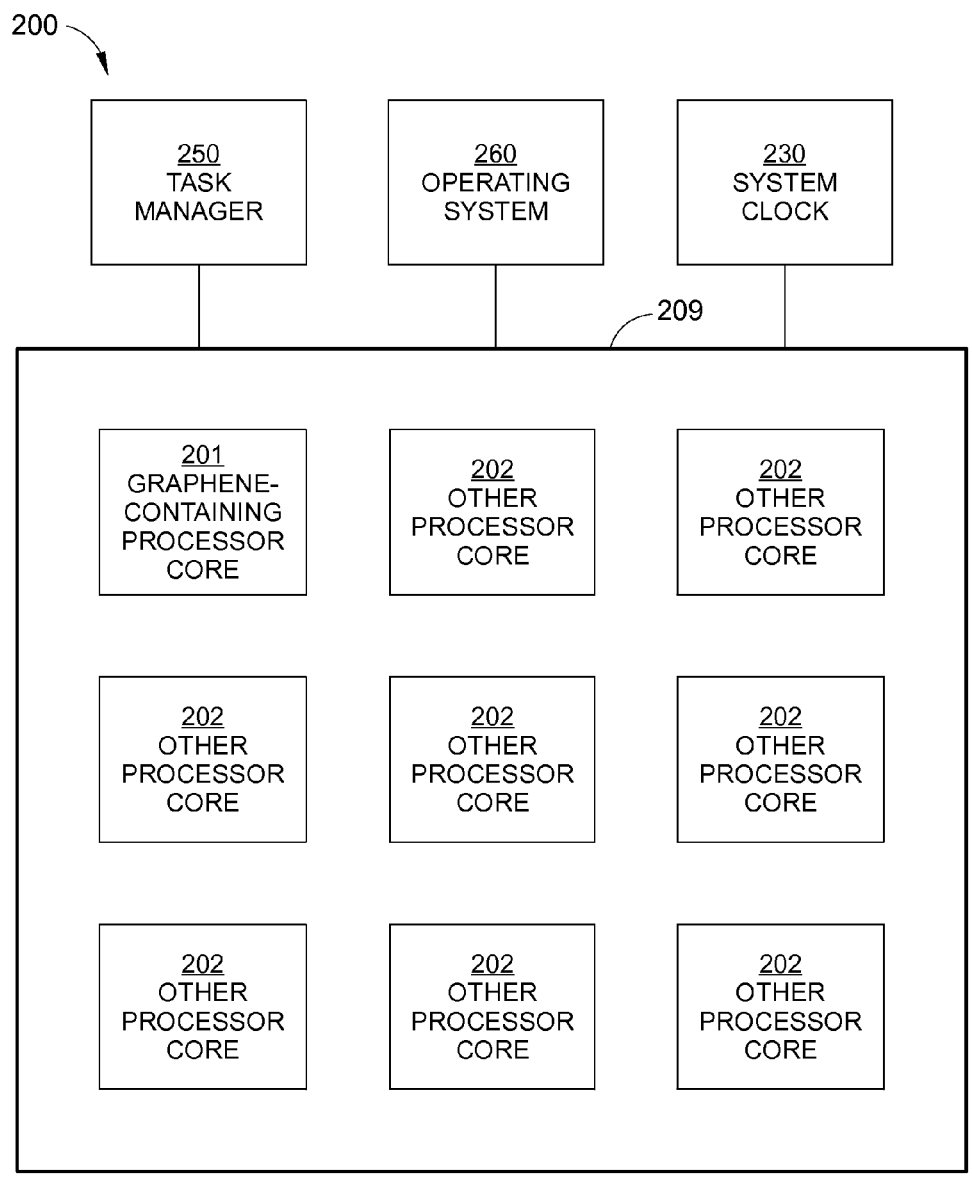
FIG. 2 shows a block diagram of an example embodiment of a chip multiprocessor (CMP)

FIG. 2 shows a block diagram of an example embodiment of a chip multiprocessor (CMP) 200, arranged in accordance with at least some embodiments of the present disclosure. CMP 200 may be a multi-core processor formed from a single integrated circuit die 209 and can be configured to carry out parallel processing tasks (e.g., processing multiple threads) using multiple processor cores formed on the die. For instance, CMP 200 may include a graphene-containing processor core 201 and two or more other processor cores 202 that include either no graphene-containing computing elements or relatively fewer graphene-containing computing elements than graphene-containing processor core 201. In the embodiment illustrated in FIG. 2, CMP 200 includes a single graphene-containing processor core 201 and eight of the other processor cores 202, however other combinations of graphene-containing processor core 201 and the other processor cores 202 may be formed on integrated circuit die 209. As shown, CMP 200 may be physically and/or operatively coupled to a task manager 250, a system clock 230, and, in some embodiments, an operating system (OS) 260. For clarity, additional shared resources included in CMP 200 that may be present on integrated circuit die 209, such as L1 and L2 cache, I/O ports, bus interfaces, and the like, are omitted from FIG. 2.

Graphene-containing processor core 201 may be any technically feasible processor or processor core that includes computing elements formed with graphene. These computing elements may include graphene-containing combinatorial elements, such as transistors, and/or graphene-containing sequential elements, such as flip-flops, among others. For example graphene-containing processor core 201 may include a specified percentage of graphene gates, e.g., transistors whose channel may be formed partially or entirely from graphene, and is therefore configured to execute software instructions or other computer-readable instructions much faster than the other processor cores 202.

In some embodiments, substantially all computing elements of graphene-containing processor core 201 may be formed with graphene. In other embodiments, combinatorial elements in graphene-containing processor core 201, such as transistors, may be formed with graphene. In yet other embodiments, specific computing elements of graphene-containing processor core 201 may be formed with graphene, with these computing elements being selected to improve performance of graphene-containing processor core 201 while minimizing or otherwise reducing leakage energy of graphene-containing processor core 201. Such selected computing elements may include combinatorial elements, sequential elements, and/or a combination of both. Having fewer graphene-containing computing elements in graphene-containing processor core 201 may significantly reduce the leakage energy thereof, while having more graphene-containing computing elements may increase the performance thereof. Thus, in such embodiments, transistors and other computing elements that are generally used the most frequently in operation may be formed with graphene, and computing elements that are less frequently used may generally not be formed with graphene. For a particular integrated circuit configuration for graphene-containing processor core 201, simulation software can be used during the design process to determine which computing elements are statistically the most- and least-used in graphene-containing processor core 201.

Each of other processor cores 202 may be any technically feasible processor or processor core that includes no computing elements formed with graphene or otherwise fewer graphene-containing computing elements relative to graphene-containing processor core. The non-graphene computing elements may include combinatorial elements and/or sequential elements that are formed with semiconductor techniques and materials, such as silicon, gallium arsenide, and the like. Consequently, each of other processors 202 may be capable of operating at a significantly lower speed than graphene-containing processor core 201, but can be used in parallel with one or more of the other processor cores 202 of integrated circuit 209 without incurring large (or with reduced) leakage energy.

Task manager 250 may be a scheduler module that can be configured to assign tasks to graphene-containing processor core 201 and the other processor cores 202. As such, task manager 250 may also be responsible for gating, e.g., switching off power to, graphene-containing processor core 201 and/or to one or more of the other processor cores 202. Task manager 250 may base such power gating on a currently determined degree of instruction-level parallelism in a software application being executed by CMP 200, as well as or alternatively based on other factors. Specifically, when a high degree of instruction-level parallelism (referred to as "parallelism" hereinafter) is determined in such a software application, task manager 250 may be configured to gate graphene-containing processor core 201 and assign tasks associated with execution of the software application to an appropriate number of the other processor cores 202. For example, when CMP 200 is executing a portion of the software application that includes substantial parallelism, such as parallel processing segment 102 in FIG. 1, task manager 250 may assign tasks to a plurality of the other processor cores 202. Alternatively, when little or no parallelism is determined in the software application, task manager 250 may direct most or all tasks to graphene-containing processor core 201 for execution. For example, in instances in which no parallelism is determined, such as when executing computing thread 115 of sequential processing segment 101 in FIG. 1, all or substantially all tasks associated with the software application may be assigned to graphene-containing processor core 201, thereby greatly enhancing performance of CMP 200.

In some embodiments, the integrated circuit configuration, e.g., the arrangement of transistors, flip-flops, etc., of one or more of the other processor cores 202 may be substantially identical to the integrated circuit configuration of graphene-containing processor core 201. In such embodiments, design and testing of CMP 200 can be greatly simplified. In other embodiments, all of the other processor cores 202 may be substantially identical to each other. In yet other embodiments, different groups of the other processor cores 202 may each have a common integrated circuit configuration, the integrated circuit configuration of each group being selected for optimal or otherwise improved processing of different applications or categories of applications. For example, one such group of the other processor cores 202 in CMP 200 may comprise graphics processing units (GPUs). In such embodiments, graphene-containing processor core 201 may have an integrated circuit configuration that is substantially identical to that of one particular group of the other processor cores 202, except that the graphene-containing processor core 201 includes graphene-containing computing element(s) in its integrated circuit configuration.

In the embodiment illustrated in FIG. 2, task manager 250 is illustrated as a separate construct in FIG. 2. In other embodiments, the functions of task manager 250 may be distributed between OS 260 and CMP 200, or may be implemented via circuitry formed on integrated circuit die 209. It is noted that in some embodiments, since power gating in a chip multi-processor may generally not be performed with a physical switch, there may still be a finite but extremely small amount of leakage energy associated with processors or processor cores in CMP 200 that have been "gated" by task manager 250.

System clock 230 may be either coupled to CMP 200 as shown in FIG. 2 or integrated into CMP 200 as one or more components thereof. In some embodiments, graphene-containing processor core 201 may be clocked at a much higher frequency than other processor cores 202. In other words, the other processor cores 202 may take several cycles to complete a computation while graphene-containing processor core 201 a single clock cycle of system clock 230. In other embodiments, system clock 230 may include multiple clocking entities for providing suitable clock signals for each of graphene-containing processor core 201 and the other processor cores 202 of CMP 200. Thus, in one embodiment, a higher-frequency clock signal may be provided to graphene-containing processor core 201 and a lower-frequency clock signal may be provided to the other processor cores 202. In embodiments in which the other processor cores 202 include groups of processors or processor cores that each operates at a different clock frequency, a suitable clock signal may be provided to each group.

Figure 3:
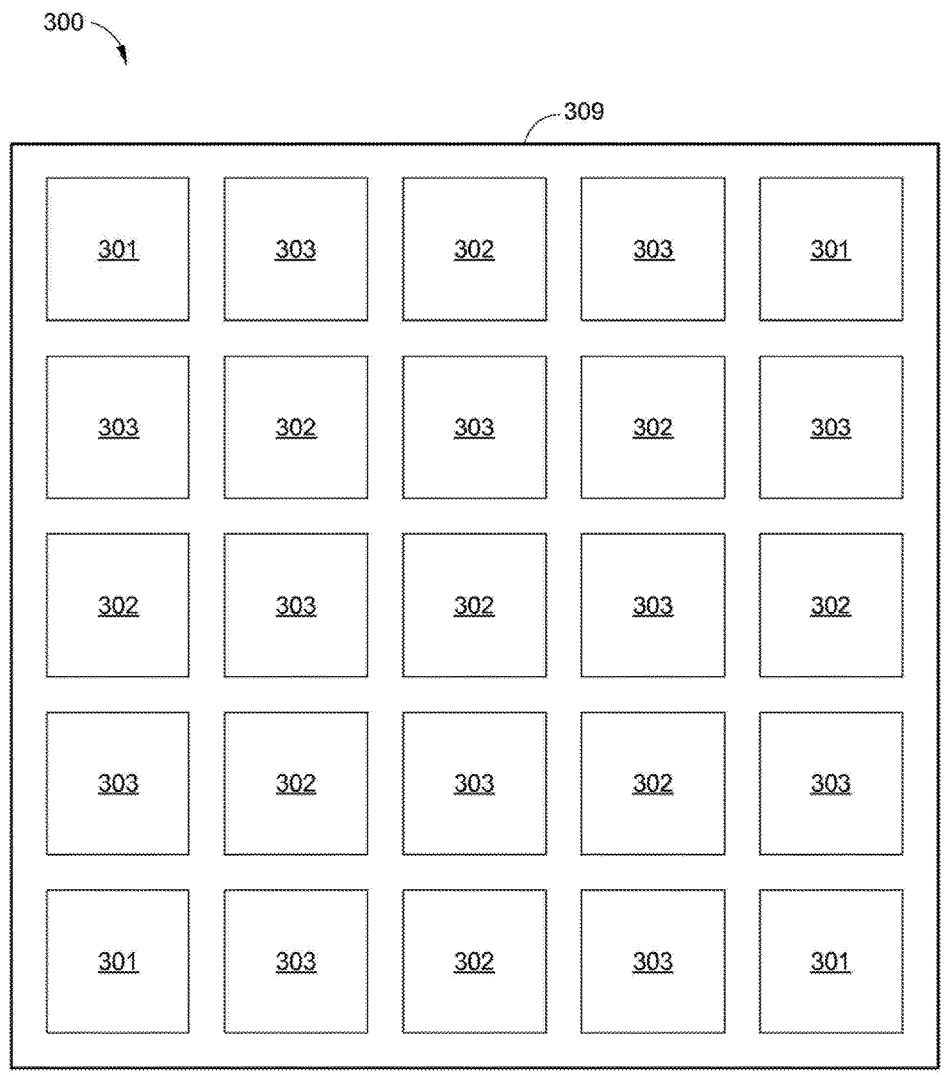
FIG. 3 shows another block diagram of an example embodiment of a CMP.

FIG. 3 shows a block diagram of an example embodiment of a CMP 300, arranged in accordance with at least some embodiments of the present disclosure. CMP 300 may be a multi-core processor formed from a single integrated circuit die 309 and may be substantially similar in configuration and operation to CMP 200, except that CMP 300 may include multiple groups of graphene-based processor cores disposed on die 309, where each group of processor cores includes processors configured to operate at a specified processor speed. Furthermore, each group of processor cores may have a different processor speed associated with the group than each of the other processor groups. In the embodiment illustrated in FIG. 3, CMP 300 includes a first group of ultra-fast processors 301, a second group of fast processors 302 (having a processor speed that is slower relative to the first group), and a third group of slowest processors 303 (having a speed that is slower than the first and second groups). In other embodiments, CMP 300 may include more or fewer than three groups of graphene-containing processors, where each group of processor cores is configured to operate at a different speed.

The first group of ultra-fast processors 301, the second group of fast processors 302, and the third group of slowest processors 303 may each be configured to execute software instructions or other computer-readable instructions at a specified speed. In some embodiments, the specified clock cycle duration for each group may be a different integer multiple of the fastest group of graphene-containing processors. For example, in some embodiments, each of ultra-fast processors 301 may be configured with a relatively high percentage of graphene-containing computing elements, so that each of ultra-fast processors 301 can execute instructions at the highest clock frequency available in CMP 300. In such embodiments, each of fast processors 302 may be configured with a lower percentage of graphene-containing computing elements than ultra-fast processors 301, so that each of fast processors 302 can execute instructions using a specified clock cycle duration that is twice that of ultra-fast processors 301. Thus, each of fast processors 302 may be configured to operate at a lower clock frequency than ultra-fast processors 301. Similarly, each of slowest processors 303 may be configured with the lowest percentage of graphene-containing computing elements (in some embodiments this may be as low as 0% graphene-containing computing elements), so that each of ultra-fast processors 301 can execute instructions using a specified clock cycle duration that is three times that of ultra-fast processors 301.

In operation, when CMP 300 executes instructions having relatively high parallelism, a suitable number of slowest processors 303 may be used, while fast processors 302 and ultra-fast processors 301 are power gated. When CMP 300 executes instructions that have little or no parallelism, a suitable number of ultra-fast processors 301 may be used, while fast processors 302 and slowest processors 303 are power gated. For example, when a substantially sequential portion of a software application is performed, the suitable number may one, so that a single ultra-fast processor 301 is used. When CMP 300 executes instructions that have moderate parallelism, a suitable number of fast processors 302 may be used, while all or most remaining processors in CMP may be power gated. In this way, the performance of CMP 300 can be optimized or otherwise improved for any specific work load. Specifically, the leakage energy of CMP 300 can be minimized or the effective processing speed of CMP maximized, depending on the nature, e.g., degree of parallelism, of instructions being executed by CMP 300, as well as on one or more specified operational constraints.

In some embodiments, operational constraints used to optimize or otherwise improve performance of CMP 300 may include an allowable time delay, an energy budget for executing certain instructions, and a thermal budget for a processor or group of processors. For example, in video streaming applications or other multi-media applications, proper playback of videos and the like involve frames and sound that are provided to a user at specific intervals, and even the smallest delay in providing such content may seriously impact the viewing experience. Consequently, in some embodiments, an allowable time delay may be used in CMP 300 for determining which of first group of ultra-fast processors 301, second group of fast processors 302, and third group of slowest processors 303 are used to execute a specified portion of a software application. In such embodiments, CMP 300 can be configured to select processors for use so that specified instructions can be completed in less than an allowable time delay, such as a time associated with a frame rate of a video. In addition, CMP 300 can be further configured to select processors for use so that energy used by CMP 300 to execute the specified instructions, e.g., the combination of leakage energy and switching energy, is minimized or otherwise reduced. Thus, in such an embodiment, CMP 300 is configured to generally select the group of processors in CMP 300 that performs the applicable operations in the specified time with the lowest cost in energy. In other embodiments, for example when CMP 300 is associated with a mobile device in which energy usage is a concern, CMP 300 may be configured to select a group of processors that performs the applicable operations with the lowest cost in energy. In yet other embodiments, CMP 300 may be configured to select a group of processors based on a combination of time delay and energy cost. In other embodiments, CMP 300 may be configured to gate processors or groups of processors that have exceeded a thermal budget or a threshold temperature. Other configurations and/or combinations thereof are also possible. Methods of selecting groups of processors in a CMP based on an allowable time delay, a thermal budget, and/or an energy budget for executing specific instructions are described below in conjunction with FIGS. 4-7.

In some embodiments, ultra-fast processors 301 may be disposed on an edge of integrated circuit die 309 to facilitate heat loss. Because ultra-fast processors 301 generally include a higher percentage of graphene-containing computing elements than other processors in CMP 300, ultra-fast processors 301 may generate significantly more heat when used to execute instructions. In some embodiments, ultra-fast processors 301 may be positioned at one or more corners of integrated circuit die 309, as shown in FIG. 3, to further enhance heat loss during operation.

In some embodiments, overheating of ultra-fast processors 301 may be avoided by arranging low-leakage processor cores, such as slower processors 303 on integrated circuit die 309 such that none of ultra-fast processors 301 are disposed adjacent to any other of ultra-fast processor cores 301. Because slower processors 303 generally include fewer or no graphene-containing computing elements, slower processors 303 may generate significantly less leakage energy than other processors in CMP 300, and can be used to thermally isolate ultra-fast processors 301 from each other. In such embodiments, slower processors 303 may also be arranged to thermally isolate other high leakage energy processors, such as fast processors 302, as shown in FIG. 3. It is noted that in FIG. 3, slower processors 303 are arranged on integrated circuit die 309 such that none of ultra-fast processors 301 or fast processors 302 are adjacent to each other. However, any other configurations of CMP 300 in which lower leakage energy processors are disposed between two or more processors having higher leakage energy also falls within the scope of this disclosure.

In some embodiments, execution of a sequential or substantially sequential portion of a software application, such as sequential processing segment 101 in FIG. 1, can be distributed between multiple graphene-containing, high-speed, high leakage energy processors in CMP 300, such as ultra-fast processors 301. As noted previously, the lack of parallelism in sequential processing segment 101 prevents more than one of ultra-fast processors 301 from executing the instruction of sequential processing segment 101 at one time. However, because any of ultra-fast processors 301 can execute sequential processing segment 101 with substantially equal speed, portions of sequential processing segment 101 can be executed sequentially by different ultra-fast processors 301 with little delay penalty. Thus, before the ultra-fast processor 301 that is executing sequential processing segment 101 reaches a non-ideal temperature and leakage energy, CMP 300 can switch execution of sequential processing segment 101 to another of ultra-fast processors 301. In this way, sequential processing segment 101 can make up a relatively large portion of a software application and still be executed with the enhanced speed of a graphene-containing, high-speed, high leakage energy processor without overheating or non-ideal high leakage energy. In such embodiments, switching the execution of sequential processing segment 101 from one of ultra-fast processors 301 to another of ultra-fast processors 301 may be based on a measured or estimated temperature of the ultra-fast processor 301 currently executing sequential processing segment 101. Alternatively, switching the execution of sequential processing segment 101 from one to another of ultra-fast processors 301 may be based on a time interval and therefore is performed repeatedly, such as periodically.

As noted above, in some embodiments, ultra-fast processors 301, fast processors 302, and slowest processors 303 may be defined by what percentage of graphene-containing computing elements are contained therein. In practice, however, the speed of a graphene-containing processor in CMP 300 may generally be an indirect function of the percentage of computing elements of the processor that are formed with graphene. This is because the computing elements in a particular processor may not all have the same utilization frequency. In other words, during typical operation of the processor, some paths of combinatorial and sequential elements in a processor may be used more than other paths. Since graphene-containing computing elements may typically contribute to the leakage energy of a processor even when disposed in an unused path of the processor, it is generally useful for the graphene-containing computing elements in the processor to have higher utilization than non-graphene computing elements. In this way, gains in processor performance are maximized relative to the additional leakage energy associated with the graphene-containing computing elements.

Because the percentage of computing elements in a processor that are formed with graphene may not be an accurate indicator of a processing speed of the processor, speed of a graphene-containing processor in CMP 300 may generally not be determined based solely on the percentage of computing elements. Instead, according to some embodiments of the disclosure, a processing speed of a graphene-containing processor in CMP 300 may be determined by running specific software applications using the graphene-containing processor of interest and directly measuring the performance of the processor. In other embodiments, a processing speed of a graphene-containing processor in CMP 300 may be estimated by performing simulations of the operation of the processor of interest in CMP 300. The simulations may include the use of a benchmark application that mathematically approximates the coded instructions that may be executed by one or more processors of CMP 300. Thus, the speed of ultra-fast processors 301, fast processors 302, and slowest processors 303 can be determined using simulations (or by measuring performance of actual processors), and appropriately adjusted in configuration so that CMP 300 can execute a software application with improved speed and energy leakage for the degree of parallelism associated with the software application.

As noted above, in some embodiments, CMP 300 may include multiple groups of processors or processor cores, where each group includes processors configured to operate at a specified processor speed. Consequently, CMP 300 may execute a software application and/or a portion of the software application in various ways, depending on which group of processors is used for execution. For example, for executing a portion of a software application having a relatively high degree of parallelism, CMP 300 may select the first group of ultra-fast processors 301, the second group of fast processors 302, or the third group of slowest processors 303. The first group of ultra-fast processors 301 has the fastest processors in CMP 300, but may not accommodate higher degrees of parallelism. In contrast, the third group of slowest processors 303 has the slowest processors in CMP 300, but can accommodate higher degrees of parallelism. Generally, the third group of slowest processors 303 may be suited for executing portions of a software application with higher levels of parallelism, but in some instances, the higher speed of ultra-fast processors 301 may make the first group of ultra-fast processors 301 the relatively optimal selection in terms of aggregate speed of execution. Thus, in some embodiments, CMP 300 may be configured to select a group of processors to execute a portion of a software application based on the aggregate speed of execution of the group of processors as well as the level of parallelism associated with the portion of software application to be executed.

As noted above, CMP 300 can use a different group of processors to execute specific portions of a software application. Thus, a software application being executed by CMP 300 may be divided into distinct portions, such as blocks of code, where each block can be executed by a group of processors selected to perform with relatively optimal time delay and/or leakage energy. In some embodiments, a convex optimization procedure may be used to allocate execution of the different blocks of code to the different groups of processors in CMP 300 based on the degree of parallelism in each block of code and on the processing speed and leakage energy associated with each group of processors. In some embodiments, static scheduling may be used for such allocation and is described below in conjunction with FIGS. 4 and 5. In other embodiments, dynamic scheduling may be used for such allocation and is described below in conjunction with FIGS. 4 and 6.

Figure 4:
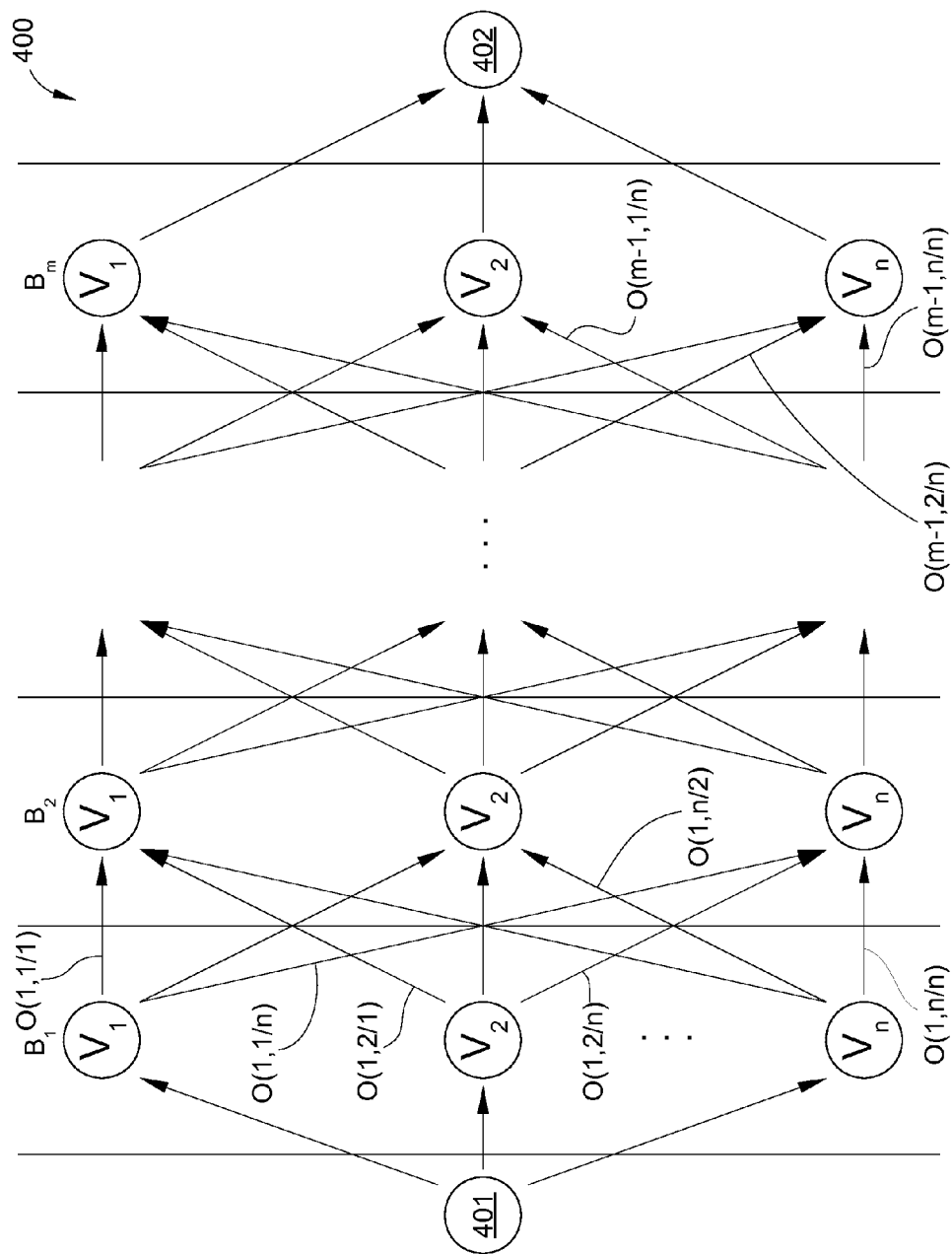
FIG. 4 is a diagram illustrating an example dynamic programming process for allocating execution of a software application between various groups of processor cores in a CMP.

FIG. 4 is a diagram illustrating, according to one or more embodiments of the disclosure, an example dynamic programming process 400 for allocating execution of a software application between various groups of processor cores in a CMP. For example, dynamic programming process 400 may allocate execution of the software application or other computer-readable instructions between the first group of ultra-fast processors 301, the second group of fast processors 302, and the third group of slowest processors 303 in CMP 300. The dynamic programming process illustrated in FIG. 4 may be applied to either a static scheduling scheme or a dynamic scheduling scheme, each of which is described below.

Dynamic programming process 400 facilitates the execution of a software program using the various groups of processors in CMP 300 in a way that satisfies one or more specified operational constraints. For example, in executing a software program, dynamic programming process 400 can be used to minimize or otherwise reduce energy cost or time delay associated with executing the software program. Alternatively or additionally, dynamic programming process 400 can be used to minimize energy cost for executing the software application while completing the execution of the software program in less than a specified maximum time period. Moreover, dynamic programming process 400 can be used to satisfy one or more other operational constraints, in lieu of or in addition to time delay and energy cost.

In dynamic programming process 400, a software application may be divided into multiple blocks, $B_1$-$B_m$, which each includes non-overlapping portions of the code making up the software application. Each of blocks $B_1$-$B_m$ can be executed by a different group of processors $V_1$-$V_n$ in a CMP, such as CMP 300, where the various groups of processors are represented as nodes $V_1$-$V_n$ in FIG. 4. In CMP 300, group of processors $V_1$ may correspond to the first group of ultra-fast processors 301, group of processors $V_2$ may correspond to the second group of fast processors 302, and group of processors $V_n$ may correspond to the third group of slowest processors 303. In other embodiments, such as when a CMP includes 10 s or 100 s of processors or processor cores, n may be a relatively large number, for example 10, 20, or more. This is because such a CMP may be configured with 10, 20, or more different groups of processors, each group of the processors including processors having a percentage of graphene or a calculated processing speed that is unique with respect to the percentages of graphene or the calculated processing speeds associated with processors in the other groups of processors.

For example, for flexibility in the application of dynamic programming process 400, group of processors $V_1$ may include a single ultra-fast processor that includes the highest percentage of graphene-containing computing elements and/ or the shortest delay time in the CMP, group of processors $V_2$ may include two ultra-fast processors that each include the second highest percentage of graphene-containing computing elements and/or the second shortest delay time in the CMP, and so on. In some embodiments, the specified clock cycle duration for group of processors $V_2$ may be an integer multiple of the specified clock cycle duration for group of processors $V_1$, for example 2. In such embodiments, the specified clock cycle duration for the other groups of processors, e.g., group of processors $V_3$, group of processors $V_n$, etc., are each progressively higher integer multiples of the specified clock cycle duration for group of processors $V_1$, for example, 3, 4, n, etc. Thus, for higher degrees of parallelism in blocks $B_1$-$B_m$, a group of processors in the CMP may be selected that can take full advantage of the parallelism. In some embodiments, the progressively higher numbers of processors and/or clock cycle durations associated with group of processors $V_1$-$V_n$ may increase by an integer value different than one, as described in the example above. Thus, the clock cycle duration for group of processors $V_2$ may be twice the clock cycle duration for group of processors $V_1$, the clock cycle duration for group of processors $V_3$ may be four times the clock cycle duration for group of processors $V_1$, the clock cycle duration for group of processors $V_4$ may be eight times the clock cycle duration for group of processors $V_1$, and so on.

Dynamic programming process 400 may also include a starting node 401, an ending node 402, and a plurality of cost vectors O(1, 1/1)-O(m−1, n/n). Cost vectors O(1, 1/1)-O(m−1, n/n) each quantify a cost associated with context switching between two nodes, where "context switching" may refer to switching execution of a software application from a first node to a second node of dynamic programming process 400. Generally, context switching may occur after the first node has completed execution of one of blocks $B_1$-$B_{m-1}$ and before the immediately following block is executed. Thus, in the notation for cost vectors O(j, k/l): m=the number of software blocks, n=the number of nodes (i.e., the number of different groups of processors), j=the completed block number, and therefore varies from 1 to m−1; k=the originating node (i.e., the group of processors that executed the completed block) and varies from 1 to n; and l=the target node (i.e., the group of processors to which execution of the software application is being switched) and varies from 1 to n. For example, cost vector O(3, ½) quantifies a cost associated with switching execution of a software program from originating node 1 (i.e., group of processors $V_1$) to target node 2 (i.e., group of processors $V_2$), the execution being switched after block $B_3$ has been completed by originating node 1 and prior to execution of block $B_4$.

In some embodiments, cost vectors O(1, 1/1)-O(m−1, n/n) may each quantify a time delay cost associated with switching execution from an originating node to a target node. In other embodiments, cost vectors O(1, 1/1)-O(m−1, n/n) may each quantify an energy cost associated with switching execution from the originating node to the target node. In a particular embodiment, cost vectors O(1, 1/1)-O(m−1, n/n) may each quantify both a time delay cost and an energy cost associated with switching execution from the originating node to the target node. Generally, the value of each of cost vectors O(1, 1/1)-O(m−1, n/n) may be proportional to the time and/or energy cost associated with sending data from the originating node to the target node. Of course, when no context switching takes place between the execution of a first block and a second block, e.g., the same group of processors executes both the first block and the second block, the value of the cost vector may be zero. Stated in cost vector notation, the value of any cost vector in which k=l is zero.

Dynamic programming process 400 may use cost vectors O(1, 1/1)-O(m−1, n/n) and execution costs associated with each group of processors $V_1$-$V_n$ to execute each block of the software application to quantify time delay cost and energy cost for each possible execution path from starting node 401 to ending node 402. Then, dynamic programming process 400 may select an optimal path from starting node 401 to ending node 402, specifying which group of processors $V_1$-$V_n$ of a CMP executes each of blocks $B_1$-$B_m$. Such a path in FIG. 4 may be selected by dynamic programming process 400 to satisfy one or more operational constraints, such as a minimum time delay, a minimum energy cost, and the like.

In some embodiments, such as in video related applications, dynamic programming process 400 may select a path in which an allowable time delay is not exceeded in executing a software application, or, in some embodiments, a specific portion or subroutine of the software application. In such embodiments, dynamic programming process 400 may be further configured to select a path that also minimizes energy expenditure without exceeding the allowable time delay. In other embodiments, for example in computing devices in which energy budget is not an issue, dynamic programming process 400 may be configured to select a path that minimizes time delay regardless of energy budget. In such embodiments, dynamic programming process 400 may further include a measured or predicted temperature of the processors in the CMP to further eliminate some possible execution paths. For example, context switching costs can be avoided by using the same group of processors in a CMP for all or most blocks of a software application, therefore many low energy-expenditure execution paths may include little or no context switching. However, because most or all of groups of processors $V_1$-$V_n$ may include graphene-containing computing elements, overheating can occur if the graphene-containing computing elements are used for extended periods of time. Consequently, dynamic programming process 400 may also include an allowable processor temperature as an operational constraint when selecting an optimal execution path.

In operation, dynamic programming process 400 may first calculate an execution cost for each group of processors $V_1$-$V_n$ to execute block $B_1$ of a software application as well as all cost vectors O(1, 1/1)-O(m−1, n/n). These cost vectors may quantify context switching costs, after execution of block $B_1$, from each group of processors $V_1$-$V_n$ to each other group of processors $V_1$-$V_n$. Dynamic programming process 400 may then store the calculated execution costs and cost vectors O(1, 1/1)-O(m−1, n/n). In some embodiments, dynamic programming process 400 may store particular combinations, e.g., the combinations of execution cost and cost vector that have less than a particular desired time and/or energy cost. In such embodiments, elimination of inferior, e.g., high cost, combinations can greatly reduce the complexity and number of calculations required for dynamic programming process 400 to provide an optimal solution. As noted above, in some embodiments, estimated processor temperatures may also be calculated as part of dynamic programming process 400, which can further point out combinations that can be considered inferior due to non-ideal processor temperatures. Furthermore, other operational constraints may be calculated and used to determine inferior combinations that are not stored.

After storage of the execution cost/cost vector combinations, dynamic programming process 400 may then repeat the above process for the next block $B_2$ of the software application. In embodiments in which inferior combinations are not stored for the previous block, in this case block $B_1$, all possible combinations of execution costs for each of processors $V_1$-$V_n$ and cost vectors O(2, 1/1)-O(2, n/n) may generally not be calculated. This is because the exclusion of inferior combinations may eliminate some possible combinations for execution of block $B_2$. For example, when all cost vectors associated with switching context to a particular group of processors, for example group of processors $V_3$, are included in inferior combinations, there may be no need to calculate any combinations that include group of processors $V_3$ for the next block, in this case block $B_2$. This process may then repeat for each remaining block of the software application.

Given the non-inferior combinations described above, dynamic programming process 400 can then determine an optimal path in terms of a specified operational constraint, such as time delay, energy delay, time delay-energy delay product, etc. Generally the solution of such a problem may be an optimization problem with a running time that is quadratic, and can be readily solved by one of ordinary skill in the art having the benefit of this disclosure.

In some embodiments, dynamic programming process 400 may be applied to a static scheduling scheme. For example, dynamic programming process 400 may be performed by task manager 250 in FIG. 2. In such embodiments, an optimal path for the execution of a software application in a CMP may be determined at compilation time. Because of this compilation-time implementation, substantially all information needed for optimization may be known when dynamic programming process 400 is used to determine an optimal path for executing a software application: the instruction-level parallelism of each block, estimated execution cost for blocks $B_1$-$B_m$ by each group of processors $V_1$-$V_n$, each of cost vectors O(1, 1/1)-O(m−1, n/n), etc. Consequently, an optimal path can be found in a substantially deterministic fashion. However, the application of dynamic programming process 400 for determining such an optimal path may add some time and energy delay to the process of executing the software application, since the process of compiling the software application can be made more complex and time-consuming and generally is completed prior to execution of the software application.

Figure 5:
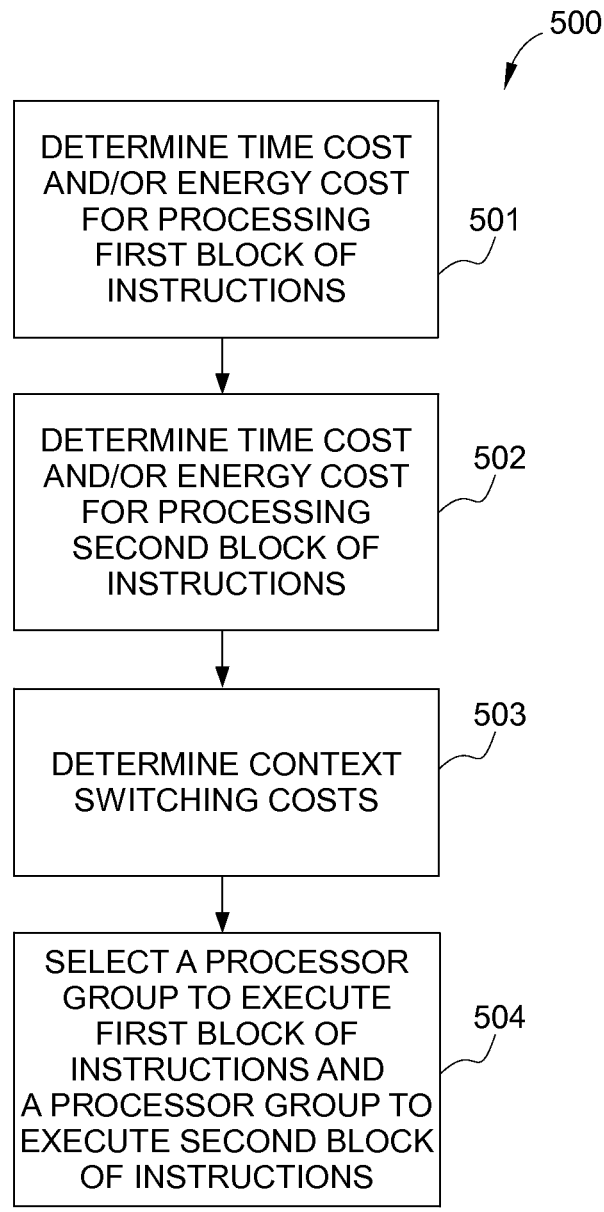
FIG. 5 is a flowchart of an example method for scheduling instructions for processing by a CMP having multiple groups of processor cores.

FIG. 5 sets forth a flowchart of an example method 500 for scheduling instructions for processing by a chip multi-processor having multiple groups of processor cores, according to an embodiment of the disclosure. Method 500 may include one or more operations, functions or actions as illustrated by one or more of blocks 501, 502, 503, and/or 504. Although the blocks are illustrated in a sequential order, these blocks may also be performed in parallel, and/or in a different order than those described herein. Also, the various blocks may be combined into fewer blocks, divided into additional blocks, and/or eliminated based upon the desired implementation. Additional blocks representing other operations, functions or actions may be provided in other embodiments. Although method 500 is described in conjunction with CMP 200 of FIG. 2 and CMP 300 of FIG. 3, other CMPs may be configured to perform method 500.

Method 500 may begin in block 501 "determine time cost and/or energy cost for processing first block of instructions." Block 501 may be followed by block 502 "determine time cost and/or energy cost for processing second block of instructions," block 502 may be followed by block 503 "determine context switching costs," and block 503 may be followed by block 504 "select a processor group to execute first block of instructions and a processor group to execute second block of instructions."

In some embodiments, prior to block 501, a task manager or other instruction-scheduling entity associated with a CMP, such as task manager 250 in FIG. 2, may separate a software application into sequential blocks, such as blocks $B_1$-$B_m$ in FIG. 4. In other embodiments, such blocks may already be defined in the software application.

In block 501, the task manager or other instruction-scheduling entity associated with the CMP determines at least one of a time cost (e.g., a time delay), an energy cost (e.g., a particular energy expenditure), a thermal cost (e.g., an estimated processor temperature increase) and/or other cost(s) for each of the multiple processor groups in the CMP to execute a first block of instructions from an application. Generally, and as described above in conjunction with FIG. 3, in a given one of the multiple processor groups, all processors may have a substantially equal percentage of graphene-containing computing elements. Furthermore, a different percentage of graphene-containing computing elements may be associated with each group, e.g., for each of the multiple processor groups, a percentage of graphene-containing computing elements associated with the processor group may be different than a percentage of graphene-containing computing elements associated with any other of the multiple processor groups.

In block 502, the task manager or other instruction-scheduling entity determines at least one of a time cost, an energy cost, a thermal cost and/or other cost(s) for each of the multiple processor groups to execute a second block of instructions from the application.

In block 503, the task manager or other instruction-scheduling entity determines context switching costs associated with switching execution of the application from any one of the multiple processor groups to any other of the multiple processor groups. In method 500, the context switching may take place after the first block of instructions is executed by a first of the multiple processor groups and before the second block of instructions is executed by a second of the multiple processor groups. Generally, blocks 502 and 503 may be repeated for all remaining blocks of the software application, so that all or most possible context switching costs may be considered as well as all or most time, energy, and/or thermal costs associated with each of the multiple processor groups executing each block of the software application.

In block 504, the task manager or other instruction-scheduling entity selects one of the multiple processor groups to execute the first block of instructions and one of the multiple processor groups to execute the second block of instructions. Generally, the selecting entity may also select which of the multiple processor groups executes each of the remaining blocks of instructions of the software application, thereby determining an optimal execution path by which the CMP can execute the software application. The selections made in block 504 may be based on the time, energy, and/or thermal costs determined in blocks 501 and 502, and on the context switching costs determined in block 503. Generally, given the information determined in blocks 501-503, the solution of such a problem is a standard optimization problem.

It is noted that method 500 can be configured as a static scheduling scheme. Consequently, in some embodiments, method 500 may be performed during compilation of the software application.

In some embodiments, dynamic programming process 400 may be applied to a dynamic scheduling scheme and may be performed by task manager 250 in FIG. 2 or any other instruction-scheduling entity associated with a particular CMP. In such embodiments, an optimal path for the execution of a software application in the CMP may not be determined at compilation time. Instead, optimal instruction scheduling may be determined for one block of a software application during execution of the software application, e.g., while the immediately preceding block of the software application is being executed. In this way, the CMP may not experience the time, energy and/or thermal costs associated with an expanded and more complex compilation process. For example, while block $B_1$ in FIG. 4 is being executed by one of the groups of processors $V_1$-$V_n$, the next group of processors may be selected that is optimal for executing block $B_2$.

Furthermore, scheduling of instructions for the software application using such a dynamic scheduling scheme can be much more adaptive than a static scheduling scheme. Specifically, scheduling of each block of instructions of the software application may be modified based on the actual execution of the software application, whereas in static scheduling, certain assumptions may be generally made regarding instruction-level parallelism of each block of the software application based on a statistical analysis of each block of instructions and other information. Therefore, in a dynamic scheduling scheme, the actual degree of instruction-level parallelism present in the software application can be taken into account when scheduling the next block of instructions: whenever some operations are not scheduled during one clock cycle, execution in the next clock cycle can be switched to a group of processors that can handle more operations; whenever processors in the current active group of processors includes one or more unused processors, execution in the next clock cycle can be switched to a group of processors that includes fewer processors. In comparison, in a static scheduling scheme, optimal scheduling for all blocks of instructions may be determined at one time, but may be based in part on estimated parallelism.

It is noted that, because each operation of dynamic scheduling generally may be made very quickly, for example in a single clock cycle, a highly optimized solution may not be determined. Unlike in static scheduling schemes, all possible execution paths via all processor groups and cost vectors may not be quantified and compared for all software blocks. Instead, the execution costs and context switching costs for a very limited number of blocks, typically the next block, can be calculated and considered in the time available.

Figure 6:
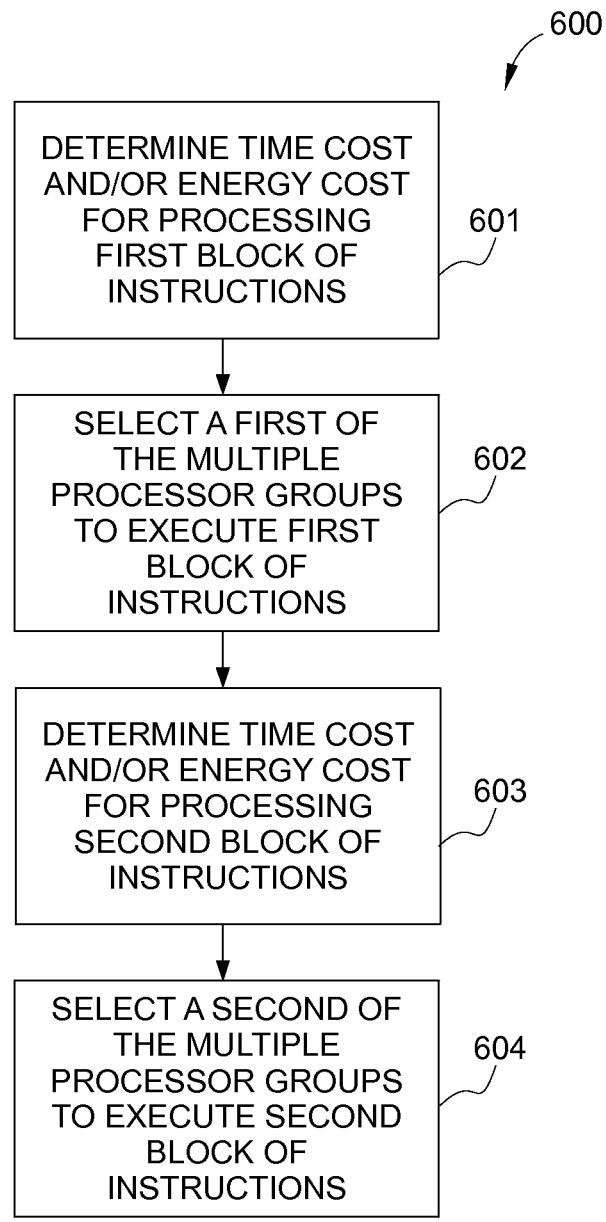
FIG. 6 is another a flowchart summarizing an example method for scheduling instructions for processing by a CMP that includes graphene-containing computing elements.

FIG. 6 sets forth a flowchart summarizing an example method 600 for scheduling instructions for processing by a chip multiprocessor that includes graphene-containing computing elements, according to an embodiment of the disclosure. Method 600 may include one or more operations, functions, or actions as illustrated by one or more of blocks 601, 602, 603, and/or 604. Although the blocks are illustrated in a sequential order, these blocks may also be performed in parallel, and/or in a different order than those described herein. Also, the various blocks may be combined into fewer blocks, divided into additional blocks, and/or eliminated based upon the desired implementation. Additional blocks representing other operations, functions or actions may be provided in other embodiments. Although method 600 is described in conjunction with CMP 200 of FIG. 2 and CMP 300 of FIG. 3, other CMPs may be configured to perform method 600.

Method 600 may begin in block 601 "determine time cost and/or energy cost for processing first block of instructions."

Block 601 may be followed by block 602 "selecting a first of the multiple processor groups to execute first block of instructions," block 602 may be followed by block 603 "determine time cost and/or energy cost for processing second block of instructions," and block 603 may be followed by block 604 "select a second of the multiple processor groups to execute second block of instructions."

In some embodiments, prior to block 601, a task manager, such as task manager 250 in FIG. 2, or other instruction-scheduling entity associated with a CMP may separate a software application into sequential blocks, such as blocks $B1$-$B_m$ in FIG. 4. In other embodiments, such blocks may already be defined in the software application.

In block 601, the task manager or other instruction-scheduling entity associated with the CMP determines at least one of a time cost, an energy cost, a thermal cost and/or other cost(s) for each of the multiple processor groups to execute a first block of instructions from the software application.

In block 602, the task manager or other instruction-scheduling entity selects a first of the multiple processor groups to execute the first block of instructions. Generally, the selection is based on at least one of the determined time, energy cost, thermal cost, and/or other cost(s) determined in block 602.

In block 603, the task manager or other instruction-scheduling entity determines at least one of a time cost, an energy cost, a thermal cost and/or other cost(s) for each of the multiple processor groups to execute a second block of instructions from the application. The second block of instructions generally may be the block of instructions immediately following the first block of instructions referenced in blocks 601 and 602. In some embodiments, the task manager or other instruction-scheduling entity may also determine context switching costs in block 603, such as cost vectors $O(1, 1/1)$-$O(1, n/n)$ in FIG. 4.

In block 604, the task manager or other instruction-scheduling entity selects a second of the multiple processor groups to execute the second block of instructions, where the selection of the second of the multiple processor groups may be performed after the first of the multiple processor groups has begun execution of the first block of instructions. In other words, block 604 generally may take place concurrently with the execution of the first block of instructions by the first of the multiple processor groups. It is noted that the first of the multiple processor groups and the second of the multiple processor groups may be the same processor group, such as when the number of processors in the currently active processor group is matched to the degree of parallelism in the currently executing block of instructions. In some embodiments, the selection may also be based on context switching costs determined in block 603. Generally, the procedures of blocks 603 and 604 may be continued until all blocks in the software application are executed.

The selection of the second of the multiple processor groups made in block 604 may be based on a level of parallelism of the application being run on the chip multiprocessor while the first of the multiple processor executes the first block of instructions. For example, when one or more operations associated with the first block of instructions are not scheduled when the first block of instructions is being executed by the first of the multiple processor groups, the second of the multiple processor groups may be a processor group having more processors than the first of the multiple processor groups. In this way, the parallelism in executing the next block of instructions, e.g., the second block of instructions, expanded to take full advantage of the degree of parallelism currently present in the software application. Alternatively or additionally, when one or more processors in the first of the multiple processor groups includes one or more unused processors, the second of the multiple processor groups may be a processor group having fewer processors than the first of the multiple processor groups. In this way, faster processors may be used to execute the next block of instructions.

As stated previously, embodiments of the disclosure can optimize or otherwise improve performance of a CMP using as operational constraints an allowable time delay, an energy budget for executing certain instructions, and/or a thermal budget for a processor or group of processors. It is noted that there are various other optimization techniques that may be used for improving performance of a CMP, such as voltage reduction (A. P. Chandrakasan, M. Potkonjak, R. Mehra, J. Rabaey, R. Brodersen, "Optimizing Power Using Transformations", IEEE Transactions on CAD, Vol. 14, No. 1, pp. 12-31, January 1995); multiple and variable supply voltage (I. Hong, D. Kirovski, G. Qu, M. Potkonjak, M. B. Srivastava, "Power Optimization of Variable Voltage Core-based Systems", IEEE Transaction on CAD, Vol. 18, No. 12, pp. 1702-1714, December 1999), (I. Hong, M. B. Srivastava, M. Potkonjak, "On-Line Scheduling of Hard Real-Time Tasks on Variable Voltage Processor", International Conference on Computer-Aided Design, pp. 653-656, November 1998), (I. Hong, G. Qu, M. Potkonjak, M. B. Srivastava, "Synthesis Techniques for Low-Power Hard Real-Time Systems on Variable Voltage Processor", Real-Time System Symposium, pp. 178-187, December 1998); multiple threshold voltage (K. Usami, M. Igarashi, F. Minami, T. Ishikawa, M. Kanzawa, M. Ichida, K. Nogami, "Automated low-power technique exploiting multiple supply voltages applied to a media processor", IEEE Journal of Solid-State Circuits, Vol. 33, No. 3, pp. 463-472, March 1998); adaptive body bias (J. W. Tschanz, J. T. Kao, S. G. Narendra, R. Nair, D. A. Antoniadis, A. P. Chandrakasan, V. De. "Adaptive body bias for reducing impacts of die-to-die and within-die parameter variations on microprocessor frequency and leakage", IEEE Journal of Solid-State Circuits, Vol. 37, No. 11, pp. 1396-1402, November 2002); clock gating (Q. Wu, M. Pedram, X. Wu, "Clock-gating and its application to low power design of sequential circuits" IEEE Transactions on Circuits and Systems I: Fundamental Theory and Applications, Vol. 47, No. 3, pp. 415-420, March 2000); gate sizing (O. Coudert, "Gate sizing for constrained delay/power/area optimization", IEEE Transactions on Very Large Scale Integration (VLSI) Systems, Vol. 5, No. 4, pp. 465-472, December 1997); retiming (M. Potkonjak, M. B. Srivastava, "Behavioral Optimization Using the Manipulation of Timing Constraints", IEEE Transaction on CAD, Vol. 17, No. 10, pp. 936-947, October 1998), and template mapping (M. R. Corazao, M. Khalaf, L. Guerra, M. Potkonjak, J. Rabaey, "Performance Optimization using Template Mapping for Datapath-Intensive High-Level Synthesis", IEEE Transaction on CAD, Vol. 15, No. 8, pp. 877-888, August 1996).

For example, if the supply voltage for a CMP is increased, the overall delay for the CMP may be reduced, while both switching and leakage energy increase. Or, if the threshold voltage is increased, the overall delay may also be increased, while both switching and leakage energy may be reduced.

The above-referenced techniques may be orthogonal to embodiments described herein and, in some embodiments, may be used in conjunction with one or more embodiments for increased effectiveness. In addition, some optimization techniques such as dynamic programming may be directly applicable with minimal modification to the delay and energy costs.

Figure 7:
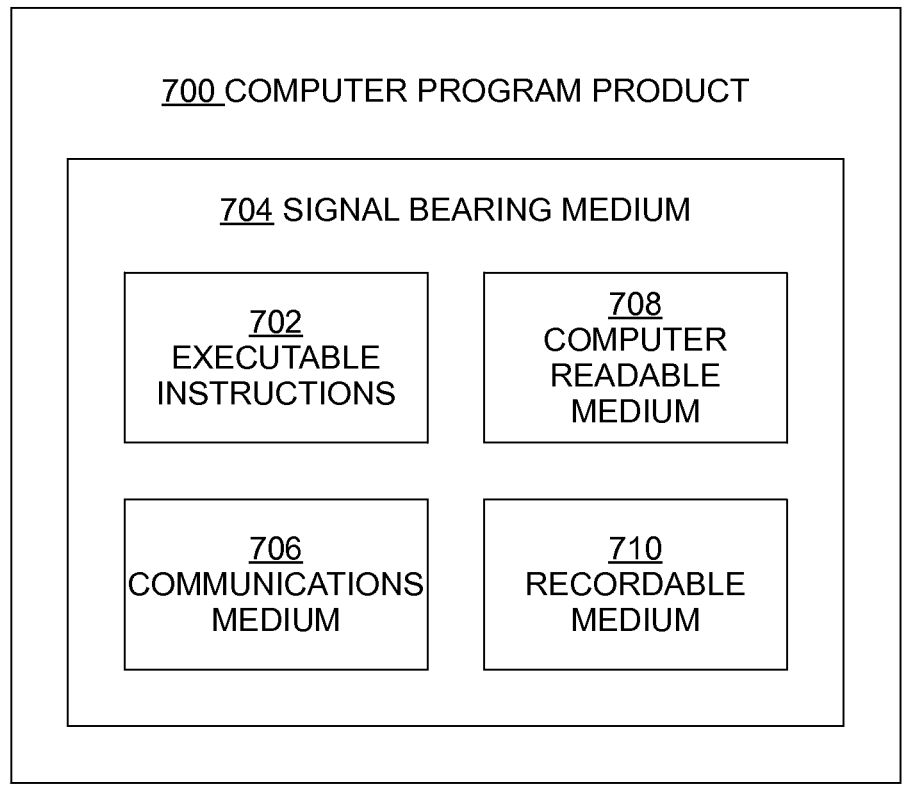
FIG. 7 is a block diagram of an illustrative embodiment of a computer program product for implementing a method for scheduling instructions for processing by a CMP that includes graphene-containing computing elements.

FIG. 7 is a block diagram of an illustrative embodiment of a computer program product 700 for implementing a method for scheduling instructions for processing by a CMP that includes graphene-containing computing elements arranged in multiple processor groups. Computer program product 700 may include a signal bearing medium 704. Signal bearing medium 704 may include one or more sets of executable instructions 702 that, when executed by, for example, a processor of a computing device, may provide at least the functionality described above with respect to FIGS. 2-6.

In some implementations, signal bearing medium 704 may encompass a non-transitory computer readable medium 708, such as, but not limited to, a hard disk drive, a Compact Disc (CD), a Digital Video Disk (DVD), a digital tape, memory, etc. In some implementations, signal bearing medium 704 may encompass a recordable medium 710, such as, but not limited to, memory, read/write (R/W) CDs, R/W DVDs, etc. In some implementations, signal bearing medium 704 may encompass a communications medium 706, such as, but not limited to, a digital and/or an analog communication medium (e.g., a fiber optic cable, a waveguide, a wired communications link, a wireless communication link, etc.). Computer program product 700 may be recorded on non-transitory computer readable medium 708 or another similar recordable medium 710.

Figure 8:
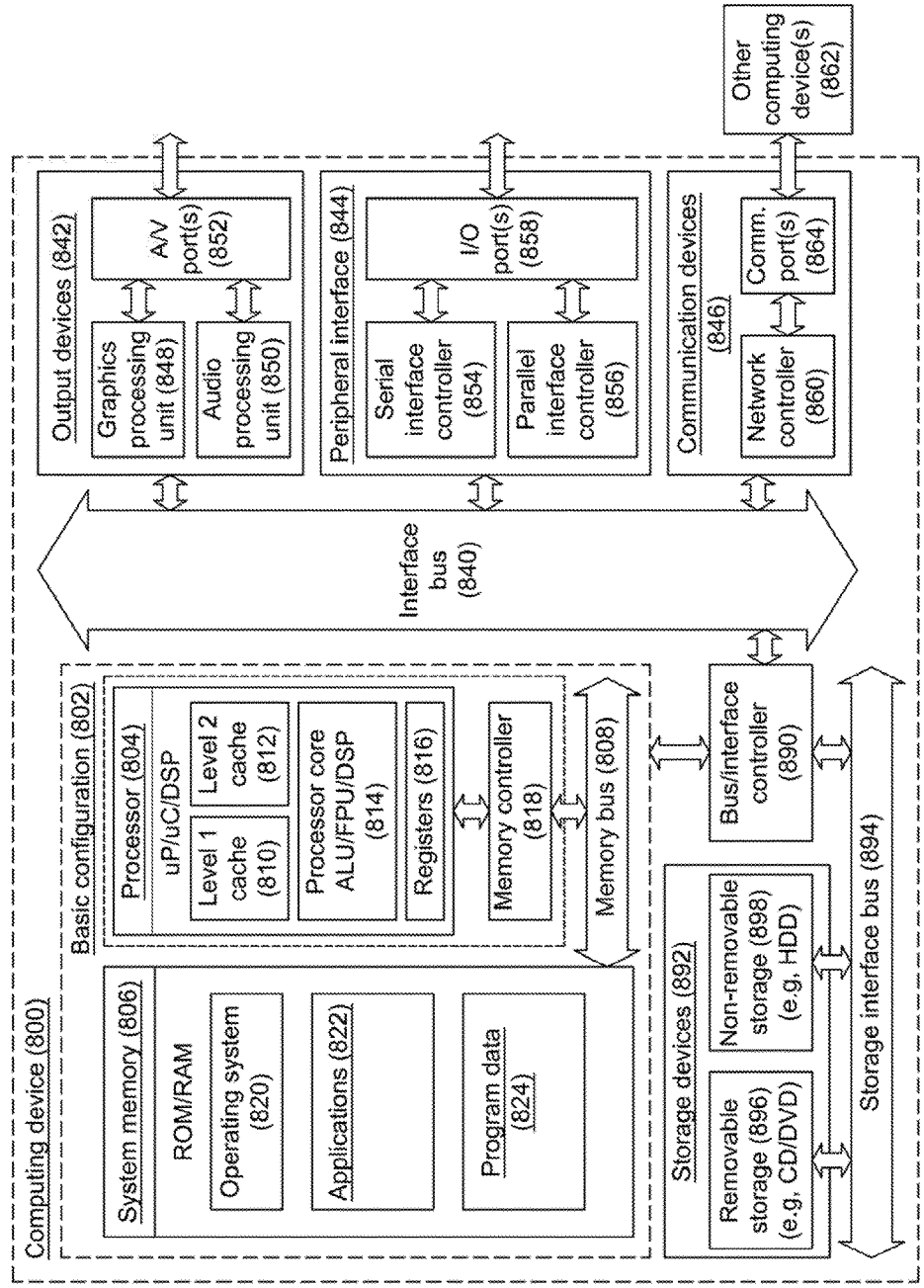
FIG. 8 is a block diagram illustrating an example computing device that is arranged for managing programmable logic circuits in a CMP, all arranged in accordance with some embodiments of the present disclosure.

FIG. 8 is a block diagram illustrating an example computing device 800 that is arranged for managing programmable logic circuits in a chip multiprocessor, in accordance with at least some embodiments of the present disclosure. In a very basic configuration 802, computing device 800 typically includes one or more processors 804 and a system memory 806. A memory bus 808 may be used for communicating between processor 804 and system memory 806.

Depending on the desired configuration, processor 804 may be of any type including but not limited to a microprocessor (μP), a microcontroller (μC), a digital signal processor (DSP), or any combination thereof. Processor 804 may include one more levels of caching, such as a level one cache 810 and a level two cache 812, a processor core 814, and registers 816. An example processor core 814 may include an arithmetic logic unit (ALU), a floating point unit (FPU), a digital signal processing core (DSP Core), or any combination thereof. Processor 804 may include programmable logic circuits, such as, without limitation, FPGA, patchable ASIC, CPLD, and others. Processor 804 may be similar to CMP 200 or in FIG. 2 or CMP 300 in FIG. 3. An example memory controller 818 may also be used with processor 804, or in some implementations memory controller 818 may be an internal part of processor 804.

Depending on the desired configuration, system memory 806 may be of any type including but not limited to volatile memory (such as RAM), non-volatile memory (such as ROM, flash memory, etc.) or any combination thereof. System memory 806 may include an operating system 820, one or more applications 822, and program data 824. Application 822 may include one or more applications separated into blocks, as described above in conjunction with FIG. 4. Program data 824 may include data that may be useful for operation of computing device 800. In some embodiments, application 822 may be arranged to operate with program data 824 on operating system 820. This described basic configuration 802 is illustrated in FIG. 8 by those components within the inner dashed line.

Computing device 800 may have additional features or functionality, and additional interfaces to facilitate communications between basic configuration 802 and any required devices and interfaces. For example, a bus/interface controller 890 may be used to facilitate communications between basic configuration 802 and one or more data storage devices 892 via a storage interface bus 894. Data storage devices 892 may be removable storage devices 896, non-removable storage devices 898, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 806, removable storage devices 896 and non-removable storage devices 898 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 800. Any such computer storage media may be part of computing device 800.

Computing device 800 may also include an interface bus 840 for facilitating communication from various interface devices (e.g., output devices 842, peripheral interfaces 844, and communication devices 846) to basic configuration 802 via bus/interface controller 830. Example output devices 842 include a graphics processing unit 848 and an audio processing unit 850, which may be configured to communicate to various external devices such as a display or speakers via one or more A/V ports 852. Example peripheral interfaces 844 include a serial interface controller 854 or a parallel interface controller 856, which may be configured to communicate with external devices such as input devices (e.g., keyboard, mouse, pen, voice input device, touch input device, etc.) or other peripheral devices (e.g., printer, scanner, etc.) via one or more I/O ports 858. An example communication device 846 includes a network controller 860, which may be arranged to facilitate communications with one or more other computing devices 862 over a network communication link, such as, without limitation, optical fiber, Long Term Evolution (LTE), 3G, WiMax, via one or more communication ports 864.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 800 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 800 may also be implemented as a personal computer including both laptop computer and non-laptop computer configurations.

Embodiments of the present disclosure enable the use of processors that include graphene-containing computing elements while minimizing or otherwise reducing the effects of high leakage energy associated with graphene computing elements. Furthermore, embodiments of the present disclosure provide systems and methods for scheduling instructions for processing by a CMP that includes graphene-containing computing elements arranged in multiple processor groups.

There is little distinction left between hardware and software implementations of embodiments of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution.

Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

I claim:

1. A chip multiprocessor, comprising;
    a first group of processor cores disposed on a die, wherein the first group of processor cores includes graphene-containing computation elements;
    a second group of processor cores disposed on the die, wherein the second group of processor cores includes a lower percentage of the graphene-containing computation elements than the first group of processor cores; and
    a third group of processor cores disposed on the die, wherein the third group of processor cores includes a lower percentage of the graphene-containing computation elements than the second group of processor cores, and wherein, the first group of processor cores are high-speed processor cores relative to the second group of processor cores and the third group of processor cores, the first group of processor cores are configured to operate when at least some processor cores of the second group of processor cores and the third group of processor cores are configured to be gated, each processor core of the third group of processor cores is arranged to facilitate thermal isolation of each processor core of the first group of processor cores such that at least one processor core of the third group of processor cores is disposed in between every two adjacent cores of the first group of processor cores, and to facilitate thermal isolation of each processor core of the second group of processor cores such that at least another processor core of the third group of processor cores is disposed in between every two adjacent cores of the second group of processor cores, the facilitation of the thermal isolation of each processor core of the first group of processor cores and each processor core of the second group of processor cores reduces an effect of leakage energy that is associated with the graphene-containing computation elements, and at least one processor core of the second group of processor cores and the at least one processor core of the third group of processor cores are disposed between every two adjacent cores of the first group of processor cores.

2. The chip multiprocessor of claim 1, wherein each processor core of the first group processor cores includes a same percentage of the graphene-containing computation elements.

3. The chip multiprocessor of claim 1, wherein the first group of processor cores are configured to operate sequentially.

4. The chip multiprocessor of claim 1, wherein operation of an active processor core of the first group of processor cores is transferred to another processor core of the first group of processor cores based on an operating temperature of the active processor core.

5. The chip multiprocessor of claim 1, wherein at least one processor core of the first group of processor cores is disposed on an edge of the die.

6. The chip multiprocessor of claim 1, wherein the first group of processor cores are configured to be gated when at least some processor cores of the second group of processor cores and the third group of processor cores are configured to operate.

7. The chip multiprocessor of claim 1, wherein the first group of processor cores are configured to operate when all processor cores of the second group of processor cores and the third group of processor cores are gated.

8. The chip multiprocessor of claim 1, wherein operation of the second group of processor cores and the third group of processor cores is based on one of: a lower frequency clock than that of the first group of processor cores, and use of multiple clock cycles of a clock associated with the first group of processor cores to perform one operation.

9. The chip multiprocessor of claim 1, wherein the graphene-containing computation elements include one or more of gates and sequential elements.

10. The chip multiprocessor of claim 1, wherein the second group of processor cores and the third group of processor cores are configured to operate in parallel.

11. The chip multiprocessor of claim 1, wherein at least two of the processor cores of the first group of processor cores are disposed at two or more corners of the die.

12. The chip multiprocessor of claim 1, wherein the chip multiprocessor is configured to select one or more processor cores of: the first group of processor cores, the second group of processor cores, and the third group of processor cores to execute a task based on an aggregate speed of execution of the first group of processor cores, an aggregate speed of execution of the second group of processor cores, an aggregate speed of execution of the third group of processor cores, and a level of parallelism of the task.

13. The chip multiprocessor of claim 1, further comprising a scheduler coupled to the first group of processor cores, the second group of processor cores, and the third group of processor cores, wherein the scheduler is configured to select one or more processor cores of: the first group of processor cores, the second group of processor cores, and the third group of processor cores based on time delay and energy cost associated with execution of instructions.

* * * * *